United States Patent [19]

Ghezzo

[11] 4,333,964
[45] Jun. 8, 1982

[54] METHOD OF MAKING INTEGRATED CIRCUITS

[75] Inventor: Mario Ghezzo, Ballston Lake, N.Y.

[73] Assignee: General Electric Company, Schenectady, N.Y.

[21] Appl. No.: 187,430

[22] Filed: Sep. 15, 1980

[51] Int. Cl.³ .................... B05D 5/12; H01L 21/306
[52] U.S. Cl. .................................. 427/93; 156/653; 427/94; 427/96; 430/313
[58] Field of Search ..................... 427/93, 94, 96; 430/313; 156/653

[56] References Cited

U.S. PATENT DOCUMENTS

| | | | |
|---|---|---|---|
| 3,675,314 | 7/1972 | Levi | 427/94 X |
| 4,091,169 | 5/1978 | Bohg et al. | 427/94 X |
| 4,110,125 | 8/1978 | Beyer | 427/94 X |

Primary Examiner—Michael R. Lusignan
Attorney, Agent, or Firm—Julius J. Zaskalicky; James C. Davis, Jr.; Marvin Snyder

[57] ABSTRACT

A method of reducing lateral field oxidation in the vicinity of the active regions of integrated circuits is described. The method utilizes a three layered masking structure for masking the active regions during field oxidation including a first very thin layer of silicon nitride in contact with the active region of the substrate, a second thin layer of silicon dioxide overlying the very thin layer of silicon nitride, and a third thick layer of silicon nitride overlying the second layer of silicon dioxide.

5 Claims, 6 Drawing Figures

METHOD OF MAKING INTEGRATED CIRCUITS

The present invention relates in general to a method of making integrated circuits and more particularly for providing on a silicon substrate a thick layer of silicon dioxide contiguous to a surface adjacent region of the substrate.

Integrated circuits include a plurality of active components dielectrically isolated on a common silicon substrate. In the making of such circuits the active regions of the silicon substrate on which the active components are formed are masked by a thin layer of silicon dioxide on which is formed a thick layer of silicon nitride. The thick layer of silicon nitride patterned to provide a retained portion serves as a mask for etching exposed portions of the layer of silicon dioxide, for etching recesses in the silicon substrate surrounding the active region and for the subsequent oxidation of the silicon in the recesses to form a field oxide which provides the dielectric isolation. The thin layer of silicon dioxide covering the active region of the substrate is provided to buffer the mismatch in thermal expansion between the silicon substrate and the silicon nitride masking layer during processing.

In the oxidation step passage of oxygen laterally through the thin layer of oxide causes growth of oxide in the outer portions of the surface of each of the active regions and produces lateral protrusions of oxide referred to in the art as "bird's beak" formations. The "bird's beak" formation occurs even when the layer of silicon nitride is made sufficiently thick to resist bending thereof. The "bird's beak" formation represents a transition region of silicon dioxide between the edge of an active region of reduced surface dimensions to the edge of the field oxide region. With a "bird's beak" formation, curvature is also produced in the surface of the active region. Thus, "bird's beak" formations result not only in shifting the edge of the active region but also result in a substantial reduction in usable surface of the substrate for the fabrication of active components thereon.

An object of the present invention is to provide a method for substantially eliminating the "bird's beak" formations in the fabrication of integrated circuits.

Another object of the present invention is to provide a relatively simple method using conventional steps to provide active regions of improved planarity and increased density in integrated circuits.

In carrying out the method of the present invention in accordance with one embodiment thereof, a substrate of semiconductor material of one conductivity type having a major surface is provided. A first thin layer of silicon nitride is formed on the major surface. A second thin layer of silicon dioxide is formed on the thin layer of silicon nitride. A third thick layer of silicon nitride is formed on the second thin layer of silicon dioxide. The third layer of silicon nitride is patterned to produce a retained portion overlying and in registry with an active region of the substrate adjacent the major surface thereof. The patterned third layer of silicon nitride is utilized to pattern the second layer of silicon dioxide to produce a retained portion overlying and in registry with the active region. The patterned second layer of silicon dioxide is utilized to pattern the first layer of silicon nitride to produce a retained portion overlying and in registry with the active region thereby exposing the major surface of the substrate contiguous to the active region. The exposed portion of the major surface of the silicon substrate is then etched to form a recess contiguous to the active region. The substrate is then heated in an oxidizing atmosphere to a temperature and for a time to cause the silicon semiconductor material contiguous to the active region to be converted to silicon dioxide. The retained portions of the first, second and third layers overlying the active region are then removed.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

Figure 1:
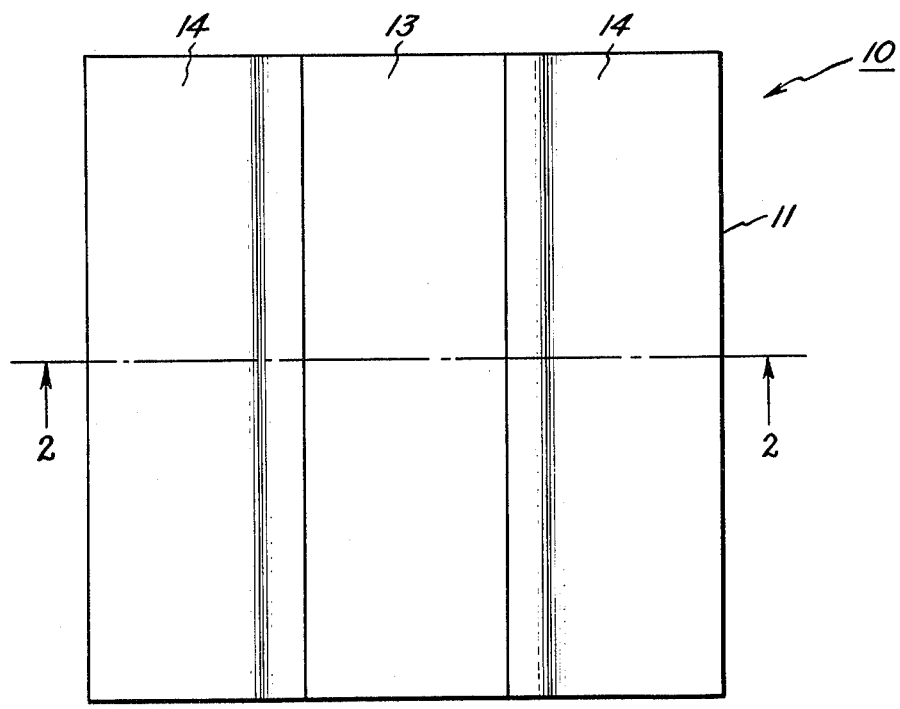
FIG. 1 is a plan view of a composite body representing a part of an integrated circuit showing a silicon substrate on which is formed a single active region surrounded by an isolating layer of thick silicon dioxide.
Figure 2:
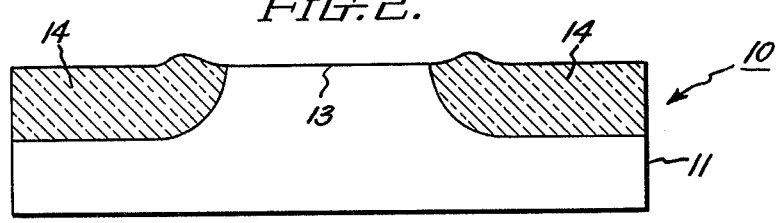
FIG. 2 is a cross-sectional view of the section of the substrate of FIG. 1 taken along section lines 2—2 thereof.

Referring now to FIGS. 1 and 2, there is shown a composite body 10 representing a section of an integrated circuit made in accordance with the present invention. The composite body 10 includes a substrate 11 having a major surface in which is provided an active region 13 surrounded by a thick layer of silicon dioxide 14. Active components of devices, such as field effect transistors (not shown), are formed in the active region and are isolated from other such active components formed on the substrate by the layer of silicon dioxide.

Figure 3A:
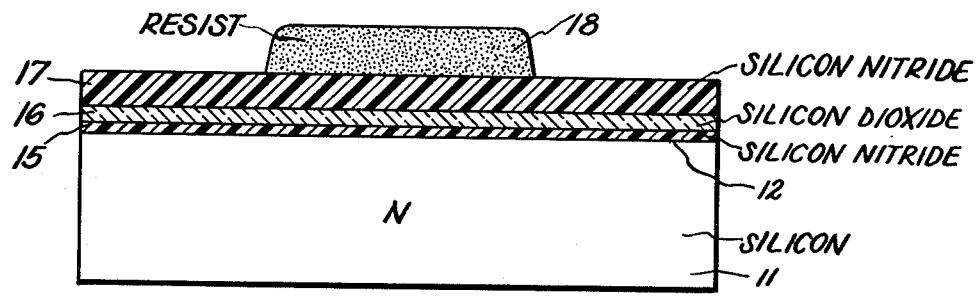
FIGS. 3A-3D show cross sections of structures representing successive steps in one method of fabricating the composite structure of FIG. 1 in accordance with the present invention.
Figure 3B:
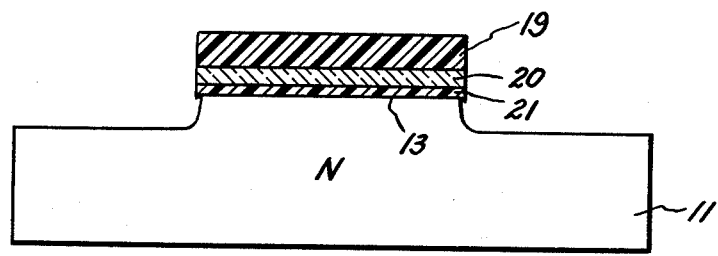
Figure 3C:
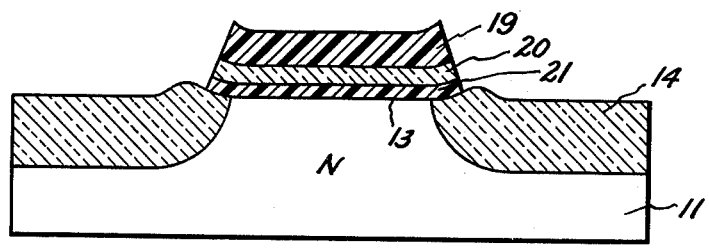
Figure 3D:
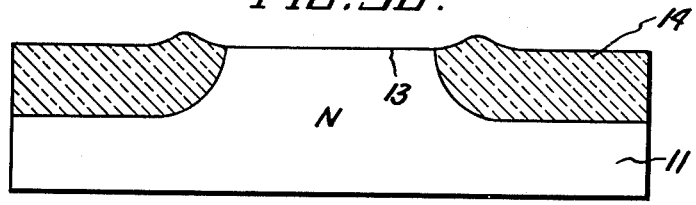

A method of fabricating the composite structure of FIGS. 1 and 2 in accordance with the present invention will now be described in connection with FIGS. 3A-3D. Elements of FIGS. 3A-3D identical to elements of FIGS. 1 and 2 are identically designated. A substrate 11 of silicon semiconductor material of 10 ohm-cm resistivity and N-type conductivity having a major surface 12 parallel to a (100) crytallographic plane thereof is provided. A first layer 15 of silicon nitride about 100 Angstroms thick is formed on the major surface 12 by techniques well known in the art, for example by chemical vapor deposition, as shown in FIG. 3A. In this process, vapors of silane and ammonia in the ratio of 1 to 200 by volume in a hydrogen carrier are utilized at a temperature of 1000° C. and for a time period of 60 seconds to form a layer of silicon nitride about 100 Angstroms thick. After cooling to about 25° C. a second layer 16 of silicon dioxide of about 300 Angstroms thick is formed on the thin layer of silicon nitride by chemical vapor deposition, for example, by using silane and nitrous oxide in a hydrogen carrier at a temperature of about 1000° C. for a time of about 3 minutes. After cooling to about 25° C. a third layer of silicon nitride is deposited on the surface of the second layer of silicon dioxide by chemical vapor deposition. In this process vapors of silane and ammonia in the ratio of 1 to 200 by volume are utilized at a temperature of 1000° C. and for a time period of 10 minutes to form a layer of silicon nitride about 1000 Angstroms thick. The layer of silicon nitride is then patterned utilizing photolithographic masking and plasma etching techniques well known in the art to provide a retained portion 19 which overlies and is in registry with the active region 13 of the substrate. The width of the active region 13 may be as small as about 1 micron. A suitable photoresist such as an azide resist AZ 1470 available from the Shipley Co. of Newton, Mass. is applied over the third layer of silicon nitride. After exposure and developing of the photoresist to provide a retained portion 18 thereof, the exposed portions of the layer of silicon nitride unprotected by the photoresist are plasma etched using carbon tetrafluoride with 4% oxygen to provide the retained portion 19 of the layer 17 of silicon nitride. Next, the second thin layer 16 of silicon dioxide unmasked by the retained portion of silicon nitride is etched in buffered hydrofluoric to provide a retained portion 20 in registry with the active region 13. Thereafter, the first layer 15 of silicon nitride unmasked by the retained portion of the second layer of silicon dioxide is etched using the plasma etch technique described above for etching the third layer of silicon nitride to provide a retained portion 21 in registry with the active region 13 and exposing the surface 12 of the substrate 11. The surface portion of the substrate underlying the unmasked portions of the thin layer of silicon dioxide is then plasma etched anisotropically with carbon tetrachloride vapors to a predetermined depth as shown in FIG. 3B. The depth of etch of the silicon substrate is selected such that subsequent regrowth of silicon dioxide in the recesses or etched out portions of the substrate is sufficiently thick to provide a surface thereof essentially coplanar with the surface of the active region. To attain such a condition the depth of etch is set to approximately 57% of the resultant thickness of the thick layer 14 of silicon dioxide. After removal of the patterned photoresist 18 by means of a suitable photoresist stripper, the substrate is heated in an oxidizing atmosphere to a temperature and for a time to cause the silicon surrounding the active region 13, that is, in the etched out portions, to be converted to a thick layer 14 of silicon dioxide substantially coplanar with the surface of the active region 13, as shown in FIG. 3C. Thereafter, the retained portion 19 of the third layer of silicon nitride, the underlying retained portion of the second layer 20 of silicon dioxide and the underlying retained portion 21 of the first layer of silicon nitride are removed utilizing suitable etches, such as hot phosphoric acid for silicon nitride and such as buffered hydrofluoric acid for silicon dioxide, to provide the resultant structure shown in FIG. 3D. Particular advantages of the structure are that the surface portion of the active region 13 retains its size and location on the major surface of the substrate essentially as assigned prior to the processing of the substrate with minimum shrinkage thereof due to the processing of the substrate to form the dielectric isolating layer 14 in accordance with the present invention. Minimizing the formation of "bird's beak" enables the planarity of the surface region to be maintained as well. At this point in the process, active devices or components, such as field effect transistors, may be readily formed in the active regions by processes well known to those skilled in the art.

The manner in which the advantages of the resultant structure are achieved will now be described. In one of the conventional techniques, as mentioned above, a two-layered masking structure of a thick layer of silicon nitride overlying a thin layer of silicon dioxide for masking the active region of the silicon substrate during field oxidation is utilized. The silicon nitride layer is made thick enough to minimize the bending thereof during field oxidation. The silicon dioxide layer is made only thick enough to accommodate the differential expansion of the silicon substrate and the silicon nitride layer to avoid creation of excessive stress in the silicon and to avoid creation of excessive dislocations therein and ultimate cracking thereof. While the two-layered structure described above reduces the size of the "bird's beak" formation, a considerable reduction of the size of the active region of the major surface of the substrate and the creation of curvature therein results due to the fact that in the oxidation of the silicon substrate to form field oxide, oxygen passes through the layer of silicon dioxide masking layer to the active region and forms silicon dioxide with silicon in the peripheral portions of the active region thereby contributing to "bird's beak" formation. In accordance with the present invention the desirable features of the two layered masking structure are retained and the undesirable feature mentioned above is eliminated. This is accomplished by providing a three layered masking structure. A first very thin layer of silicon nitride, for example, about 100 Angstroms thick immediately overlies and is in contact with the active region of the surface of the silicon substrate. A second thin layer of silicon dioxide about 300 Angstroms thick overlies the first thin layer of silicon nitride. A third layer of silicon nitride about 800 Angstroms thick overlies the second thin layer of silicon dioxide. The first thin layer of silicon nitride serves as an excellent oxygen mask blocking the passage of oxygen moving laterally through the second thin layer of silicon dioxide, thus eliminating this source of oxygen contributing to "bird's beak" formation. While the differential expansion of the first thin layer of silicon nitride and the silicon substrate creates stresses at the interface these stresses are relieved by structural deformation of the thin layer of silicon nitride before they attain a magnitude which results in unacceptable damage to the surface of the active region of the substrate. The third thick layer of silicon nitride performs its usual function of providing an oxygen barrier during the growth of field oxide and hence masking normal oxidation of the substrate in the active region. In view of the fact that silicon dioxide formation in the peripheral portions of the active region is reduced, less bending force is produced on the third thick layer of silicon nitride and hence the thickness of this layer can be reduced over what otherwise would be required. The second thin layer of silicon dioxide performs its desired function of accommodating mismatch between the surface of the silicon substrate and the thick layer of silicon nitride. A suitable range for the thickness of the first layer is from about 100 to about 150 Angstroms. A suitable range for the thickness of the second layer is from about 200 to about 400 Angstroms. A suitable range for the thickness of the third layer is from about 800 to 1500 Angstroms.

While the silicon substrate unmasked by the retained portions 19, 20 and 21 of the first layer of silicon nitride, the second layer of silicon dioxide and the third layer of silicon nitride was etched prior to oxidation of the substrate to form thick silicon dioxide, this step could be eliminated, if desired, with the result that the surface of the active region and the outer surface of the thick oxide would be less planar.

While the invention has been described in a specific embodiment, it will be understood that modifications, such as those described above, may be made by those skilled in the art and it is intended by the appended claims to cover all such modifications and changes as fall within the true spirit and scope of the invention.

What is claimed is:

1. The method of providing in a substrate of silicon semiconductor material having a major surface, a thick layer of silicon dioxide contiguous to a region of said substrate adjacent said major surface comprising:

providing said substrate of silicon semiconductor material having said major surface, forming a first thin layer of silicon nitride on said major surface, forming a second thin layer of silicon dioxide on said layer of silicon nitride, forming a third layer of silicon nitride on said second layer of silicon dioxide, patterning said third layer of silicon nitride to produce a retained portion overlying and in registry with said region on said major surface, patterning said second layer of silicon dioxide to produce a retained portion overlying and in registry with said region on said major surface, patterning said first layer of silicon nitride to produce a retained portion overlying and in registry with said region on said major surface, heating said substrate in an oxidizing atmosphere to a temperature and for a time to cause the silicon semiconductor material contiguous to said region to be converted to silicon dioxide.

2. The method of claim 1 in which said first layer has a thickness in the range from about 100 to about 150 Angstroms, said second layer has a thickness in the range from about 200 to about 400 Angstroms, and said third layer has a thickness in the range from about 800 to about 1500 Angstroms.

3. The method of claim 1 in which the portion of said silicon substrate exposed by patterning said first layer of silicon nitride is etched to a first depth to form a recession therein contiguous to said region prior to heating said substrate in an oxidizing atmosphere.

4. The method of claim 1 in which said retained portions of said first, second, and third layers overlying said region are removed.

5. The method of claim 3 in which said first depth is about 57% of the thickness of said thick layer of silicon dioxide.

* * * * *